United States Patent
Toet et al.

(10) Patent No.: US 6,933,530 B2
(45) Date of Patent: Aug. 23, 2005

(54) PROCESS FOR DIRECT INTEGRATION OF A THIN-FILM SILICON P-N JUNCTION DIODE WITH A MAGNETIC TUNNEL JUNCTION

(75) Inventors: Daniel Toet, Mountain View, CA (US); Thomas W. Sigmon, Albuquerque, NM (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/943,475

(22) Filed: Sep. 17, 2004

(65) Prior Publication Data

US 2005/0083729 A1 Apr. 21, 2005

Related U.S. Application Data

(62) Division of application No. 10/260,067, filed on Sep. 27, 2002, now Pat. No. 6,828,180, which is a division of application No. 09/746,981, filed on Dec. 22, 2000, now Pat. No. 6,541,316.

(51) Int. Cl.$^7$ ............................................. H01L 29/04
(52) U.S. Cl. .............................. 257/75; 257/66; 257/70; 257/74
(58) Field of Search .............................. 257/64, 65, 66, 257/70, 72, 74, 75, 295

(56) References Cited

U.S. PATENT DOCUMENTS

| | | | | |
|---|---|---|---|---|
| 4,400,409 A | * | 8/1983 | Izu et al. ..................... 438/62 |
| 4,728,997 A | * | 3/1988 | Szydlo et al. ................. 257/53 |
| 5,940,319 A | * | 8/1999 | Durlam et al. ............... 365/171 |
| 5,985,698 A | * | 11/1999 | Gonzalez et al. ........... 438/128 |
| 6,180,444 B1 | * | 1/2001 | Gates et al. ................. 438/237 |
| 6,180,871 B1 | * | 1/2001 | Campbell et al. ............. 257/75 |

* cited by examiner

Primary Examiner—Kevin M. Picardat
(74) Attorney, Agent, or Firm—Michael C. Staggs; Alan H. Thompson

(57) ABSTRACT

A process for direct integration of a thin-film silicon p-n junction diode with a magnetic tunnel junction for use in advanced magnetic random access memory (MRAM) cells for high performance, non-volatile memory arrays. The process is based on pulsed laser processing for the fabrication of vertical polycrystalline silicon electronic device structures, in particular p-n junction diodes, on films of metals deposited onto low temperature-substrates such as ceramics, dielectrics, glass, or polymers. The process preserves underlayers and structures onto which the devices are typically deposited, such as silicon integrated circuits. The process involves the low temperature deposition of at least one layer of silicon, either in an amorphous or a polycrystalline phase on a metal layer. Dopants may be introduced in the silicon film during or after deposition. The film is then irradiated with short pulse laser energy that is efficiently absorbed in the silicon, which results in the crystallization of the film and simultaneously in the activation of the dopants via ultrafast melting and solidification. The silicon film can be patterned either before or after crystallization.

12 Claims, 3 Drawing Sheets

PROCESS FOR DIRECT INTEGRATION OF A THIN-FILM SILICON P-N JUNCTION DIODE WITH A MAGNETIC TUNNEL JUNCTION

CROSS-REFERENCE TO RELATED APPLICATION

This application is a division of U.S. application Ser. No. 10/260,067, filed Sep. 27, 2002 now U.S. Pat. No. 6,828,180, which is a division of U.S. application Ser. No. 09/746,981, filed Dec. 22, 2000 now U.S. Pat. No. 6,541,316, both entitled "Process For Direct Integration Of A Thin-Film Silicon P-N Junction Diode With A Magnetic Tunnel Junction."

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the fabrication of junction diodes, particularly to a process for forming thin-film silicon junction diodes on a thin metal film, and more particularly to direct integration of a thin-film silicon p-n junction diode with a magnetic tunnel junction for use in advanced magnetic random access memory cells, such as used for high-performance, non-volatile memory.

Magnetic random access memory (MRAM) using giant magneto-resistance (GMR) materials and spin-dependent tunneling (MTJs) has been developed for high-performance, non-volatile memory. Such memory cells have significant advantage over previous state-of-the-art in that they are current-perpendicular-to-plane (CPP) devices, that is, sense current flows perpendicularly from word-to-bit line through the memory, whereas, in previous configurations, sense current flowed in the plane (CIP) of the memory element. The CPP configuration results in a number of advantages including minimum size cell and ease of dimensional scaling with semiconductor feature sizes. The basic magnetic storage element in a CPP MRAM cell consists of two magnetic multilayers (GMR films) separated by a thin insulator (for instance $Al_2O_3$). The magnetization moments of the two films may be either parallel or anti-parallel, such alignment defining either a logic "1" or "0" for the cell. These states are written by passing a write current through the word and bit line. This current, which should not flow through the cell, creates a magnetic field that switches the direction of the moment of one of the GMR layers. For the read process, a sense current is passed perpendicular through the cell, generating a voltage from the magneto-resistance of the cell. Thus, the magneto-resistance of the cell contains the information on the state of that cell.

For fabrication of a memory from these cells, the cells are placed between word and bit line intersections, forming an array of n×n cells. To write or read a cell, $n_i$, the word and bit lines whose intersection occurs at $n_i$ are activated. However, since the cells are essentially resistors, problems arise in read and write sensitivity as a result of shunt currents passing through cells other than $n_i$. Such problems are eliminated by placing an electronic switch between the word and bit lines in series with each magnetic cell. Such a device can be a diode or transistor whose impedance is controlled by differences between the word and bit line voltages.

Accordingly, there is a need for providing this electronic switch between word and bit lines in series with the magnetic cell. There is also a need for developing a fabrication process allowing the construction of a silicon diode or transistor directly onto a metal word or bit line that can be manufactured. There is also a need for this process to be low temperature, so as to not affect the metal word or bit lines or underlying or adjacent Si electronics.

The present invention provides a solution to the above needs wherein the needs are met by direct vertical integration of a diode or transistor (voltage controlled switch) with the MTJ stack between the word and bit lines. This process is carried out without thermal damage to the underlying Complementary Metal Oxide Semiconductor Integrated Circuit (CMOS IC) circuitry by using appropriate low temperature deposition steps in conjunction with a pulsed energy source for melting, recrystallizing, and doping the deposited amorphous Si films. This allows formation of the p-n junction or TFT directly onto the surface of the word/bit lines.

SUMMARY OF THE INVENTION

It is an object of the present invention to provide a non-linear element (switch) between two metal conductors in an electric circuit that is fabricated directly onto one of the metal conductors.

A further object of the invention is to provide a process allowing the construction of a silicon diode or transistor directly onto a metal word or bit line, without damage to underlying or adjacent components.

Another object of the invention is to provide a process, based on pulsed laser processing, for the fabrication of vertical polycrystalline silicon electronic device structures, in particular p-n junction diodes, on films of metal deposited on low temperature-substrates, such as ceramics, dielectrics, glass, or polymers.

Another object of the invention is to provide a process for direct integration of a thin-film, Si p-n junction diode, or transistor, with a magnetic tunnel junction stack for use in advanced, high-performance magnetic random access memory cells.

Other objects and advantages of the present invention will become apparent from the following description and accompanying drawings.

The process of the present invention is suitable for implementation of current-perpendicular-to-plane (CPP) magnetic tunnel junction memory cells (MTJs) for use in non-volatile, high-performance, high-density magnetic random access memories. Such a memory cell consists of a magnetic storage device connected in series with a current control device such as a diode or transistor whose purpose is to control the current in the cell. Such cells are described in detail in U.S. Pat. Nos. 5,640,343 and 5,838,608. The purpose of this current control device is to provide selectivity in the read process for a selected cell (i.e., preventing unwanted currents from flowing through other unselected cells and causing erroneous read signals) and to isolate the selected memory cell from write currents used in the write process. The process allows direct integration of the current control element vertically with the magnetic element at low temperatures. This allows fabrication of the memory cell at the crossing of the word and bit lines, resulting in a minimum size, scalable configuration.

The process is based on pulsed laser processing, for the fabrication of vertical polycrystalline silicon electronic device structures, in particular p-n junction diodes, on films of metal deposited onto low temperature-substrates such as ceramics, dielectrics, glass, or polymers. The process preserves underlayers and structures onto which the devices are typically deposited, such as silicon integrated circuits. The process involves the low temperature deposition of one or several layers of silicon, either in an amorphous or a polycrystalline phase. Dopants may be introduced in the film during or after the Si deposition from the gas phase, by normal deposition processes, by plasma processes, or by ion implantation. The films are then irradiated with a short-pulse energy source that is efficiently absorbed in the Si, such as provided by a XeCl excimer laser. This results in the crystallization of the film and simultaneously in the activation of the dopants via ultrafast melting and solidification. The films can also be crystallized and doped by heating an over layer film with the energy source to a temperature that results in melting and recrystallization of the underlying amorphous or poly-Si films. The silicon films can be patterned either before or after crystallization. The fabrication process also involves low temperature deposition of various metal films, such as W and Mo, and dielectric layers, such as $SiO_2$ or $Si_3N_4$, for device and circuit fabrication purposes.

The process involves a non-linear element (switch) between two metal conductors in an electrical circuit that is fabricated directly onto one of the metal conductors. Potential use in certain types of magnetic memory cells relying on current perpendicular to the device plane, integration into integrated circuits, replace discrete non-linear elements for electronic applications. Provide thin film transistor structures and diode structures, both lateral and vertical to fabricate poly-Si thin film electronics on a wide variety of substrates, such as finished integrated circuits, metal lines, layers, ceramic films, and layers. An example device enabled by this technology is the vertical magnetic tunnel junction cell for fabrication of non-volatile, low power memory. This cell has immediate potential to replace $E^2$-PROM, presently considered a major semiconductor memory technology.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
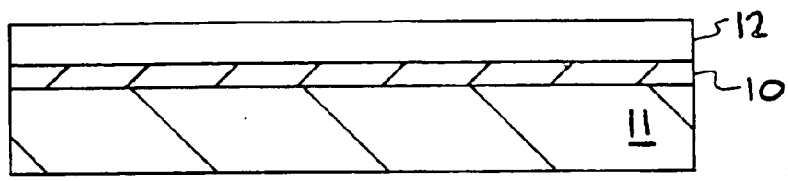
FIGS. 1, 2, 3, and 4a–4c are simplified views illustrating the operational sequence of the process of the invention in the fabrication of the diode on the metal word or bit line.

The present invention is directed to the fabrication of polysilicon (poly-Si) diodes for magnetic tunnel junction memory arrays using laser processing.

As pointed out above, magnetic tunnel junction (MTJ)-based random access memory (MRAM) arrays have received considerable attention recently because of their potential for non-volatile, high-density data storage. In order to enable selective reading and writing, each individual memory cell must be coupled with a non-linear element such as a diode. Since the magnetic cells are to be placed at the intersection of the word and bit lines controlling the cells, fabrication of the diodes directly onto one of these metal lines would ensure scalability, higher cell densities, and a greater simplicity of manufacturing. This implies that the diodes must be configured vertically. The temperatures involved in the diode fabrication process must be kept low (preferably below 400° C.) to preserve underlying structures, e.g., the CMOS addressing circuitry. Another important requirement is that the dynamic resistance of the diode needs to be relatively low to match the resistance of the cell (on the order of 1 k$\Omega$), so that the diode resistance does not interfere with the read-cycle.

Described hereinafter is a technique, based on pulsed laser processing, enabling the fabrication of both vertical p-n and Schottky poly-Si diodes on metal films. Pulsed laser processing, especially excimer laser crystallization (ELC), has recently developed as the leading technology for the fabrication of poly-Si-based large-area electronic systems (e.g., AMLCDs) on low-temperature substrates such as glass and plastic. ELC is based on the ultrafast melting and solidification resulting from the absorption of the laser radiation by a thin a-Si film and allows for the fabrication of high quality, large-grained poly-Si thin films. Due to the very short duration of this process (typically a few hundred ns), underlying layers (especially the substrate) remain unaffected. Alternative poly-Si fabrication methods, such as solid phase crystallization or direct deposition by low-pressure chemical vapor deposition, usually require static heating of the wafer to around 600° C. and yield small grained material. A further advantage of pulsed laser processing is that the fast melting and solidification allows for the incorporation and activation of dopants, and for the definition of steep doping profiles. Conventional doping methods, on the other hand, often require high temperature anneals and complex processes to achieve abrupt dopant profiles.

The invention consists of fabricating a poly-Si, microcrystalline Si or amorphous-Si p-n junction diode onto a thin metal line/film. The process consists of the evaporation, sputtering, chemical vapor deposition or other means, of a thin film of amorphous or microcrystalline silicon either doped or undoped onto a thin metal film such as tungsten or molybdenum. Either donor or acceptor species, depending on the diode polarity required for the specific application, can be incorporated during or following the Si deposition, using a variety of techniques including ion implantation, gas immersion laser doping, and dopant deposition. For the formation of poly-Si diode, a short pulsed laser that is efficiently absorbed in Si is used to melt and recrystallize the deposited Si, resulting in the formation of large grain poly Si and the activation of the incorporated dopant species. Fabrication of the opposite polarity region of the diode can proceed either by further deposition of amorphous or microcrystalline Si, doping, and laser-induced activation. Alternatively, the initial dopant can be overcompensated in the top layer of the Si film (e.g., by implanting the top layer with a heavy dose of donor atoms if the starting film is p-type), followed by activation using a partial laser-induced melt. After this process metal contacts films are deposited on the upper surface of the diode and patterned to form the device. Following patterning the contacts may be sintered to improve their specific contact resistance to the underlying silicon.

The process of the present invention is described hereinafter with respect to FIGS. 1, 2, 3, and 4a–4c. Experimental verification of the invention has been carried out and FIGS. 5A and 5B illustrate a layout of a poly-Si n+-p diode and the layout of a poly-Si Schottky diode utilized in the experimental verification, described hereinafter.

FIG. 1 illustrates the first step in the process, which is to deposit an interlayer metal 10 onto a metal row line 11. This interlayer metal is required to be of high melting temperature (e.g., W, Ti, Mo, Ta, Co, . . . ) whose purpose is to prevent the metal row line, most likely made of Al or Cu from intermixing with the silicon layer during the subsequent processing. The interlayer metal thickness is typically 1000 to 2000 angstroms or so. Next an amorphous Si film 12 is deposited onto the interlayer metal to a thickness of 1000 to 2000 angstroms. It is important during the deposition of both the interlayer metal and amorphous silicon not to heat the system (consisting of metal row lines, and underlying CMOS circuitry) to a level to create diffusion or intermixing or other deleterious effects to the row metal or underlying CMOS circuitry.

Figure 2:
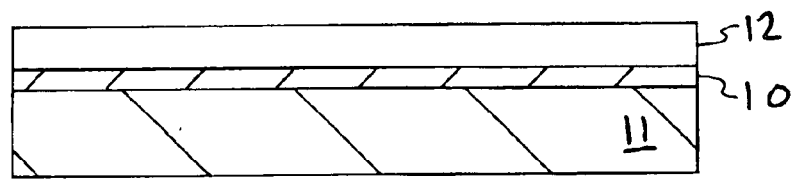

For formation of a p-n junction diode the amorphous silicon must have a p-type dopant incorporated into it at the appropriate level as shown in FIG. 2. This can be accomplished during the deposition process via various standard techniques or deposited into/onto the film following deposition by techniques such as ion implantation (into) or deposition (onto).

Figure 3:
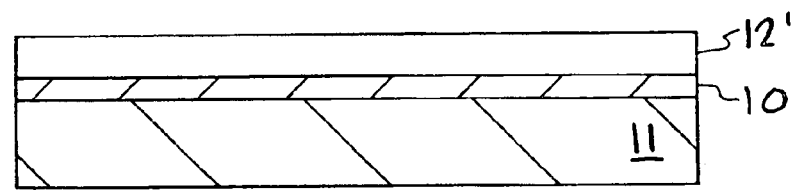

The crucial step in the formation of a high quality p-n diode is to transform the amorphous p-type silicon film 12 into large grain, low defect density polysilicon, indicated at 12'. This step is accomplished by, as shown in FIG. 3, by using a short pulse of energy (15–20 nanosecond range) whose absorption into the film occurs in roughly the first 100 angstroms or so. This pulse of energy can be provided by a pulsed laser such as a pulsed excimer, doubled NdYag or doubled Alexanderite. These lasers provide the necessary energy deposition rate to result in melting of the overlying a-Si, following the melt step, the film recrystallizes. This can occur via superlateral grain growth, or spontaneous nucleation of the grains and depends upon the selection of laser parameters.

Figure 4A:
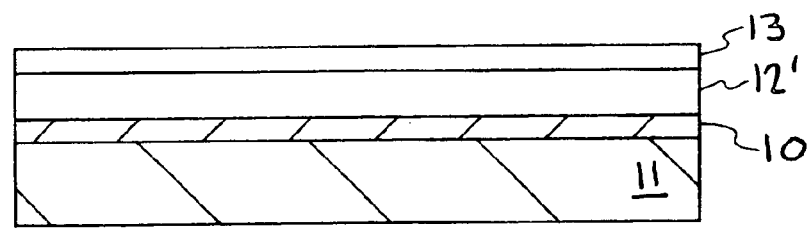

Doping of the n+ layer of the polysilicon 12' is then accomplished, as shown in FIG. 4a, by depositing a monolayer of dopant 13 onto the surface of the p-type polysilicon 12'. The dopant atoms are driven into the polysilicon and made electrically active by melting a fraction of the depth of the polysilicon film with a short pulse of energy as described before, thus forming an n+-p diode. The result is shown in FIG. 4c.

Figure 4B:
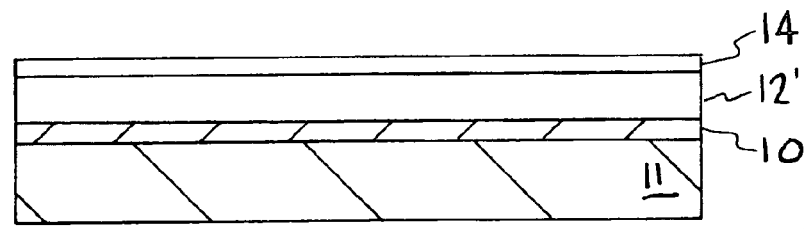

An alternative method to forming the n+ contact is to ion implant the upper layer of the polysilicon 12' with the appropriate ion species 14 followed by a pulsed energy melt crystallization and dopant activation as described preceding, as shown in FIG. 4b.

Figure 4C:
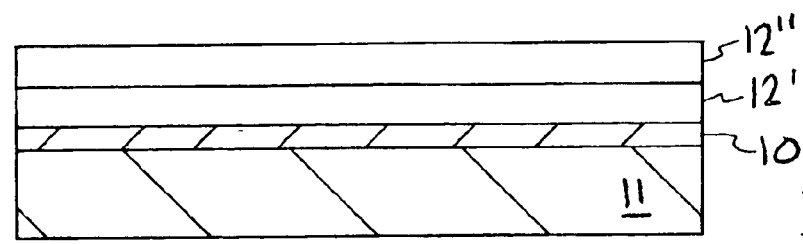
Figure 5A:
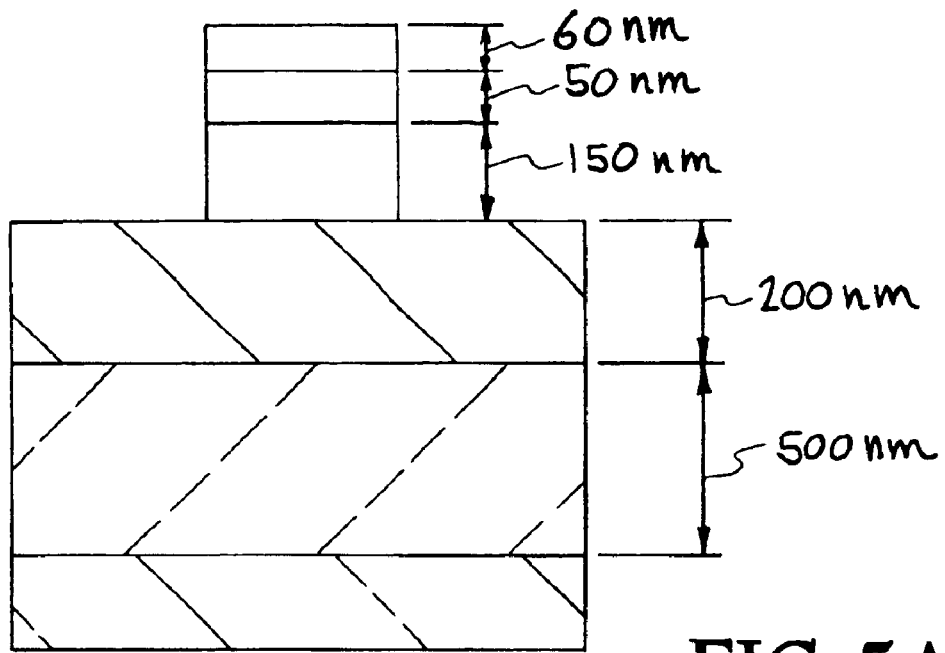
FIG. 5A schematically illustrates an embodiment of polysilicon $n^+$-p diode fabricated in accordance with the present invention.
Figure 5B:
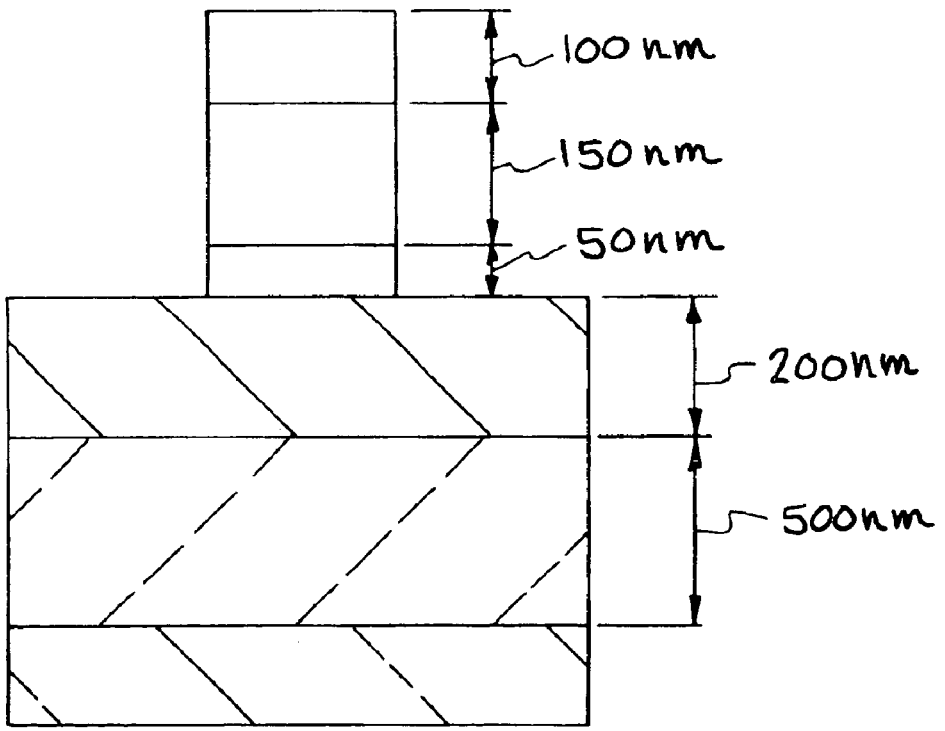
FIG. 5B schematically illustrates an embodiment of a polysilicon Schottky diode made by the process of the present invention.

FIG. 4c illustrates the formation of n+-p silicon films 12' and 12" on metal layer for subsequent fabrication of a vertical MTJ MRAM cell.

Fabrication of the MRAM will then be carried out using techniques which are known by the industry to pattern and define the memory elements and to create the interconnects which allow addressing of the MRAM via the underlying CMOS circuitry.

Experimental verification on the invention is described hereinafter under the headings: Diode Fabrication Process for p-n diodes and Schottky diodes, a Characterization:

I. Diode Fabrication Process a) p-n diodes

The substrates used in our fabrication procedure were 4" Corning 1737 glass wafers. These wafers were coated with a 500 nm thick $SiO_2$ layer using plasma enhanced chemical vapor deposition (PECVD) at 250° C. Thin (200 nm) metal layers were subsequently deposited on this barrier oxide, using low-temperature DC sputtering. Since this metal film undergoes intense (though rapid) heating during the laser-induced crystallization of the Si film coating, care was taken to optimize the deposition conditions with respect to the laser processing. The Si films (thickness 150 nm) were deposited using PECVD at 380° C., and implanted with a moderate dose ($10^{13}$ $cm^{-2}$) of boron atoms at an energy of 25 keV. The dopants were activated by melting the Si using short UV pulses ($\lambda$=308 nm, $\tau$=35 ns) delivered by a XeCl excimer laser, which simultaneously crystallizes the films. The melt depth was determined by extracting the melt duration from time-resolved measurements of the reflectivity of a HeNe laser beam incident on the center of the spot irradiated by the XeCl laser. This melt duration is easily determined by virtue of the fact that liquid Si has metal-like optical properties (its reflection coefficient at 632.8 nm is 0.7 compared to 0.4 for solid Si). The correspondence between melt depth and melt duration can be obtained using a finite-element heat transport calculation for the experimental configuration under consideration. Next, a thin (5 nm) $PF_5$ film was deposited on top of the poly-Si film using a PECVD process. The phosphorus dopant atoms were driven in the Si and activated by melting the top 50 nm of the Si, thereby forming the n+-side of the junction. The top metal contact, a 60 nm thick Cr film, was then deposited on the poly-Si by low-temperature DC sputtering. The films were then patterned into small islands using photolithography. The structure of the resulting n+-p diode is schematically illustrated in FIG. 5A.

b) Schottky diodes

The metal-coated glass wafers described previously were also for the Schottky diode fabrication. The bottom (ohmic) contact was formed by depositing a 50 nm film of Si onto the metal, implanting to a dose of $2 \cdot 10^{15}$ $cm^{-2}$ of arsenic and activating the dopants by melting and crystallizing this film using XeCl laser irradiation. A second Si film (thickness: 150 nm) was then deposited on top of this contact layer and implanted to a dose of $2 \cdot 10^{11}$ $cm^{-2}$ of phosphorus. This film was molten up to the interface with the underlying layer, simultaneously resulting in its crystallization and the activation of the phosphorus dopants. The Schottky barrier metal, a 100 nm thick W film, was deposited next, using DC sputtering. The diode stack was then patterned using photolithography, followed by a reactive ion etch in a $SF_6$ plasma. The resulting structure is shown in FIG. 5B.

II. Characterization a) Structural properties

A cross-sectional transmission electron microscopy image was made of a 50 nm thick laser-crystallized Si film on a 100 nm thick metal layer deposited on a glass substrate. The most striking feature was the abruptness of the Si/metal interface, suggesting that little or no interdiffusion has taken place during the laser crystallization process. The poly-Si film consisted of grains with in-plane dimensions (average size: 600 nm) that are much larger than the film thickness. Protruding ridges mark the boundaries between the grains. This type of structure is characteristic for the so-called "super-lateral growth" regime obtained when the laser fluence is slightly below that needed to melt the Si film completely. This mechanism is often utilized in the fabrication of poly-Si TFTs for AMLCD applications.

b) Dopant concentration profiles

Figure 6:
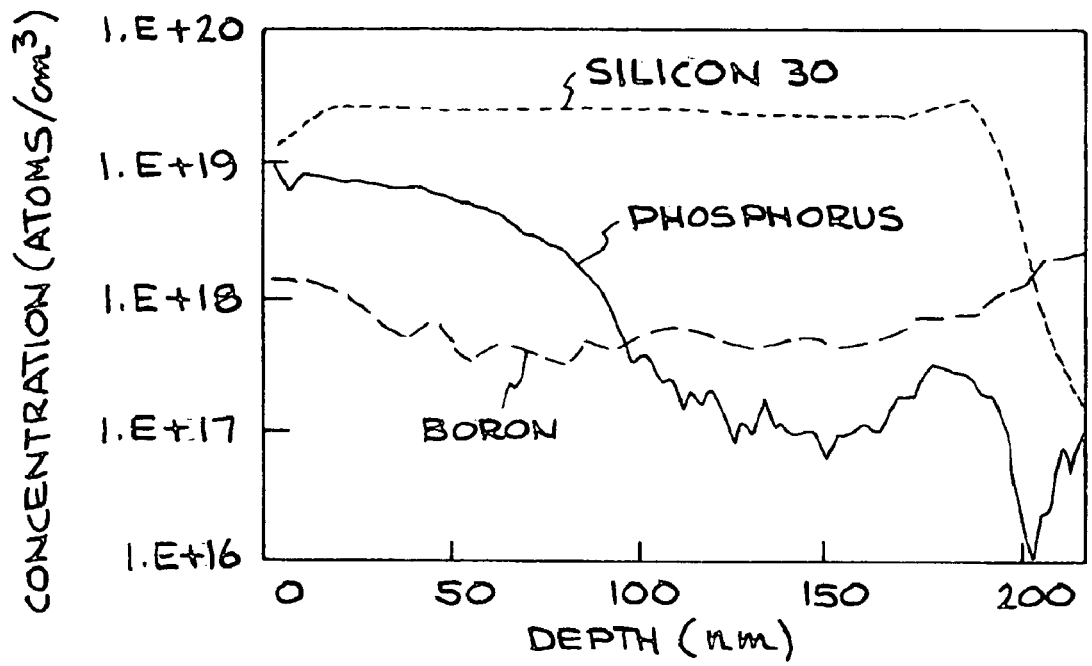
FIG. 6 graphically illustrates dopant concentration profiles in a vertical polysilicon $n^+$-p diode made by the present invention.

The boron and phosphorus concentration profiles in a 190 nm thick Si film processed in a manner similar to that described in Section II. a) are shown in FIG. 6. As can be observed, a junction has clearly formed in the film, at a depth of about 100 nm. The P concentration profile at the junction is relatively shallow, decaying at a rate of 1 decade per 33 nm. This effect is probably a result of the diffusion of phosphorus along grain boundaries, although the roughness of the Si surface also contributes to the measured width of the profile. This artifact, characteristic for SIMS, is reflected in the width of the Si profile at the Si/metal interface.

c) I–V characteristics

Figure 7:
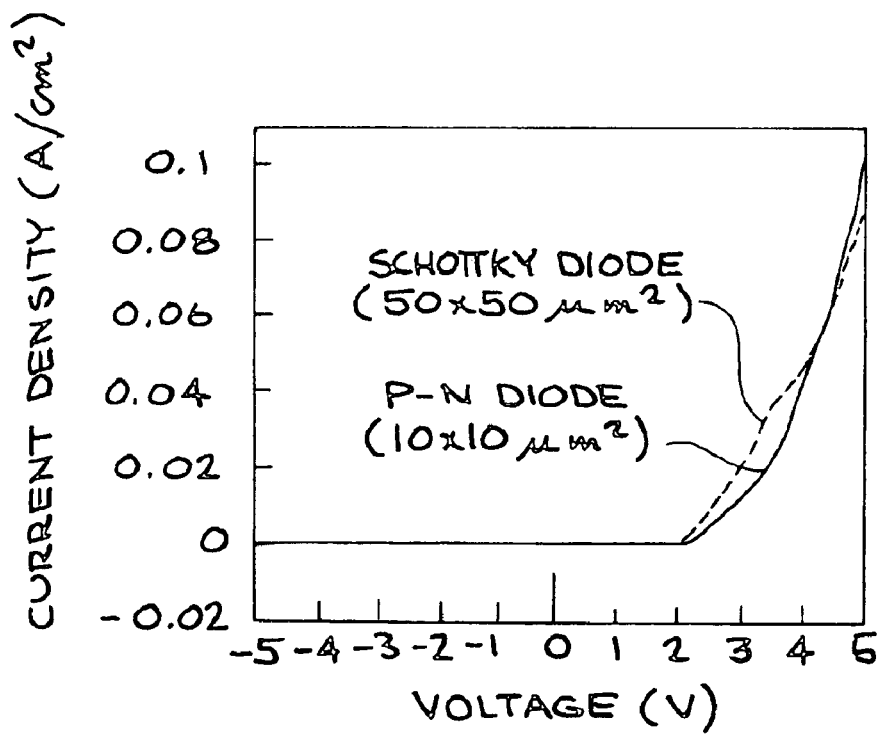
FIG. 7 graphically illustrates characteristics of a vertical $n^+$-p diode and a vertical Schottky diode fabricated by excimer laser processing in accordance with the present invention.

Electrical characterization of the diodes was performed using an automated probe station. One of the probes was placed directly on the top of the structure, while the other made contact with the bottom metal. FIG. 7 shows measured I–V characteristics for a 10×10 $\mu m^2$ $n^+$-p diode and a 50×50 $\mu m^2$ Schottky diode. These results clearly demonstrate the non-linear behavior of the devices: for negative biases, the current stays below 100 pA in all cases, while for positive biases, the current increases exponentially as a function of voltage. At 5 V, the forward current density reaches 0.1 A/cm$^2$ in the p-n diode and 0.08 A/cm$^2$ in the Schottky diode. These relatively low values are most likely a result of difficulty in contacting the very shallow junction using a metal probe, effectively resulting in a high series resistance dominating the forward current. This is confirmed by the high values of the differential resistivity (5.7 MΩ for the p-n diode, 0.7 MΩ for the Schottky diode at 5 V) and the turn-on voltage (2.1 V for the p-n diode, 1.0 V for the Schottky diode).

We have demonstrated the fabrication, using excimer laser-induced crystallization and doping, of vertical poly-Si p-n and Schottky diodes on thin metal films. These devices are important for applications in high-density memory devices such as MTJ-MRAMs. The heating and cooling inherent to excimer laser processing is so rapid that underlying circuit layers and dopant profiles remain unaffected, resulting in a fabrication technique that is compatible with constructing the memory directly onto the CMOS addressing circuitry. At this time, the measured electrical properties of the diodes are not ideal, but this is believed to be due to contacting problems.

It has thus been shown that the invention provides a process for direct integration of a thin-film Si p-n junction diode with magnetic tunnel junction for use in advanced MRAM cells for high performance, non-volatile memory arrays.

While particular embodiments, materials, parameters, etc. has been described and illustrates to exemplify and teach the principles of the invention, such are not intended to be limited. Modifications and changes may become apparent to those skilled in the art, and it is intended that the invention be limited only by the scope of the appended claims.

What is claimed is:

1. An MTJ MRAM cell comprising a thin-film silicon p-n junction diode, wherein said p-n junction diode further comprises:
    a metal layer,
    a layer of pulsed laser treated amorphous silicon having a p-type dopant on said metal layer, and
    a fractional layer of pulsed laser electrically activated n-type dopant disposed within said pulsed laser treated amorphous silicon so as to form an $n^+$-p junction on said metal layer.

2. The cell of claim 1, wherein said pulsed laser treated amorphous silicon layer comprises a polysilicon layer of less than about 100 angstroms.

3. The cell of claim 2, wherein one or more pulses of laser energy, each of said pulses having a temporal width of at least about 15 nanoseconds are arranged for pulse laser treatment and electrically activation.

4. The cell of claim 3, wherein said one or more pulses comprises pulses produced by excimer lasers, Nd YAG lasers, or Alexendrite lasers.

5. The cell of claim 3, wherein said one or more pulses are designed to produce a treatment and activation temperature of less than about 400° C.

6. The cell of claim 1, wherein said n-type dopant is arranged by ion implantation.

7. The cell of claim 1, wherein said n-type dopant is arranged by deposition.

8. The cell of claim 6, wherein said n-type dopant is made electrically active by melt crystallization.

9. The cell of claim 7, wherein said n-type dopant is driven into said polysilicon and made electrically active by melt crystallization.

10. The cell of claim 1, wherein doping said layer of pulsed laser treated amorphous silicon with said p-type dopant is carried out during or after deposition of an amorphous silicon layer.

11. The cell of claim 1, wherein said metal layer comprises at least one metal selected from W, Ti, Mo, Ta and Co.

12. The cell of claim 11, wherein said metal layer comprises a thickness between about 500 angstroms and about 2000 angstroms.

* * * * *